(12) United States Patent
Gao et al.

(10) Patent No.: US 12,532,468 B2
(45) Date of Patent: *Jan. 20, 2026

(54) THREE-DIMENSIONAL MEMORY DEVICES WITH CHANNEL STRUCTURES HAVING PLUM BLOSSOM SHAPE

(71) Applicant: YANGTZE MEMORY TECHNOLOGIES CO., LTD., Wuhan (CN)

(72) Inventors: Tingting Gao, Wuhan (CN); Lei Xue, Wuhan (CN); Xiaoxin Liu, Wuhan (CN); Wanbo Geng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 1213 days.

This patent is subject to a terminal disclaimer.

(21) Appl. No.: 17/112,594

(22) Filed: Dec. 4, 2020

(65) Prior Publication Data
US 2022/0123010 A1     Apr. 21, 2022

Related U.S. Application Data

(63) Continuation of application No. PCT/CN2020/121810, filed on Oct. 19, 2020.

(51) Int. Cl.
| H10B 43/27 | (2023.01) |
| H10D 30/69 | (2025.01) |
| H10D 64/01 | (2025.01) |

(52) U.S. Cl.
CPC ......... *H10B 43/27* (2023.02); *H10D 30/694* (2025.01); *H10D 64/037* (2025.01)

(58) Field of Classification Search
None
See application file for complete search history.

(56) References Cited

U.S. PATENT DOCUMENTS

| 10,593,697 B1 | 3/2020 | Hu et al. |
| 2010/0155810 A1 | 6/2010 | Kim et al. |
| 2013/0207225 A1 | 8/2013 | Sakui |
| 2014/0035023 A1 | 2/2014 | Ahn |

(Continued)

FOREIGN PATENT DOCUMENTS

| CN | 107623006 A | 1/2018 |
| CN | 107863348 A | 3/2018 |

(Continued)

OTHER PUBLICATIONS

International Search Report issued in corresponding International Application No. PCT/CN2020,121810, mailed Jul. 15, 2021, 5 pages.

(Continued)

*Primary Examiner* — Jack S Chen
(74) *Attorney, Agent, or Firm* — BAYES PLLC

(57) ABSTRACT

Embodiments of three-dimensional (3D) memory devices and methods for forming the same are disclosed. In an example, a 3D memory device includes a substrate and a channel structure extending vertically above the substrate and having a plum blossom shape including a plurality of petals in a plan view. The channel structure includes, in each of the plurality of petals, a semiconductor channel and a channel plug above and in contact with the semiconductor channel.

20 Claims, 13 Drawing Sheets

(56) References Cited

U.S. PATENT DOCUMENTS

2018/0182776 A1\* 6/2018 Kim .................... H10D 30/693
2022/0123011 A1\* 4/2022 Gao ....................... H10B 43/10

FOREIGN PATENT DOCUMENTS

| CN | 109417071 A | 3/2019 |
| CN | 109712977 A | 5/2019 |
| CN | 109727908 A | 5/2019 |
| CN | 110520990 A | 6/2019 |
| CN | 110707085 A | 1/2020 |
| CN | 110880513 A | 3/2020 |
| CN | 111146206 A | 5/2020 |
| CN | 111180459 A | 5/2020 |
| CN | 111785733 A | 10/2020 |
| TW | 201903972 A | 1/2019 |
| TW | 202013689 A | 4/2020 |
| TW | 202021100 A | 6/2020 |
| TW | I695385 B | 6/2020 |

OTHER PUBLICATIONS

International Search Report issued in corresponding International Application No. PCT/CN2020,121811, mailed Jul. 19, 2021, 5 pages.

\* cited by examiner

THREE-DIMENSIONAL MEMORY DEVICES WITH CHANNEL STRUCTURES HAVING PLUM BLOSSOM SHAPE

CROSS-REFERENCE TO RELATED APPLICATIONS

This application is a continuation of International Application No. PCT/CN2020/121810, filed on Oct. 19, 2020, entitled "THREE-DIMENSIONAL MEMORY DEVICES WITH CHANNEL STRUCTURES HAVING PLUM BLOSSOM SHAPE," which is hereby incorporated by reference in its entirety. This application is also related to U.S. application Ser. No. 17/112,635, filed on Dec. 4, 2020, entitled "THREE-DIMENSIONAL MEMORY DEVICES WITH CHANNEL STRUCTURES HAVING PLUM BLOSSOM SHAPE AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a substrate and a channel structure extending vertically above the substrate and having a plum blossom shape including a plurality of petals in a plan view. The channel structure includes, in each of the plurality of petals, a semiconductor channel and a channel plug above and in contact with the semiconductor channel.

In another example, a 3D memory device includes a continuous blocking layer, a continuous charge trapping layer, and a continuous tunneling layer each following a plum blossom shape from outside to inside in this order in a plan view. The 3D memory device also includes a plurality of separate semiconductor channels each disposed laterally over part of the continuous tunneling layer at a respective apex of the plum blossom shape, and a plurality of separate petal capping layers each disposed laterally over a respective one of the plurality of semiconductor channels. The 3D memory device further includes a continuous core capping laterally surrounded by the plurality of petal capping layers and the tunneling layer. The petal capping layer and the core capping layer include different dielectric materials.

In still another example, a method for forming a 3D memory device is disclosed. A channel hole extending vertically above a substrate and having a plum blossom shape in a plan view is formed. A blocking layer, a charge trapping layer, a tunneling layer, and a semiconductor channel layer each following the plum blossom shape along sidewalls of the channel hole are sequentially formed. A protection layer is formed over the semiconductor channel layer, such that an apex thickness of the protection layer at each apex of the plum blossom shape is greater than an edge thickness of the protection layer at edges of the plum blossom shape. Parts of the protection layer that are at the edges of the plum blossom shape are oxidized. The oxidized parts of the protection layer are removed to expose parts of the semiconductor channel layer that are at the edges of the plum blossom shape, leaving a remainder of the protection layer at each apex of the plum blossom shape. The exposed parts of the semiconductor channel layer are removed to separate the semiconductor channel layer into a plurality of semiconductor channels each at a respective apex of the plum blossom shape.

In yet another example, a method for forming a 3D memory device is disclosed. A channel hole extending vertically above a substrate and having a plum blossom shape in a plan view is formed. A continuous blocking layer, a continuous charge trapping layer, and a continuous tunneling layer each following the plum blossom shape are formed from outside to inside in this order along sidewalls of the channel hole. A plurality of separate semiconductor channels each disposed laterally over part of the continuous tunneling layer at a respective apex of the plum blossom shape are formed. A plurality of separate channel plugs each disposed above and in contact with a respective one of the plurality of separate semiconductor channels are formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
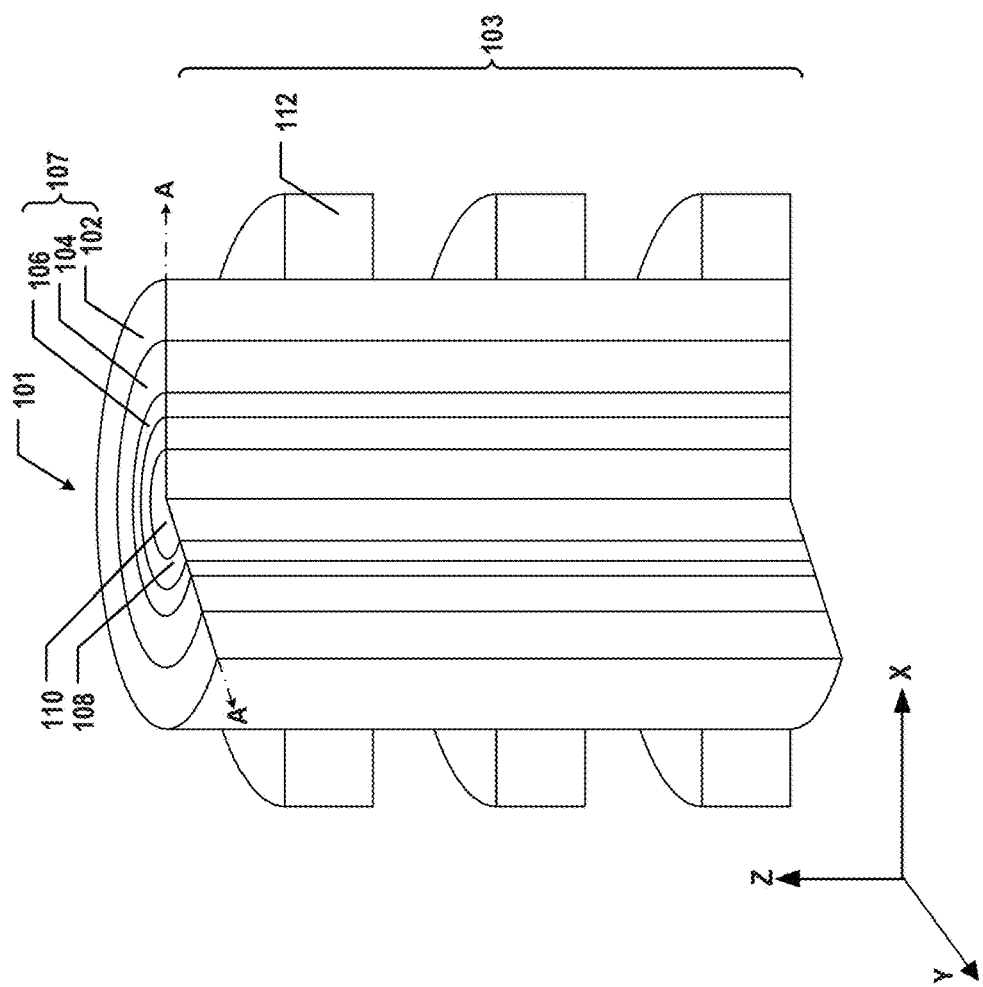
FIG. 1 illustrates a plan view of a cross-section and a top perspective view of another cross-section of a 3D memory device having a circular channel structure.
Figure 1:
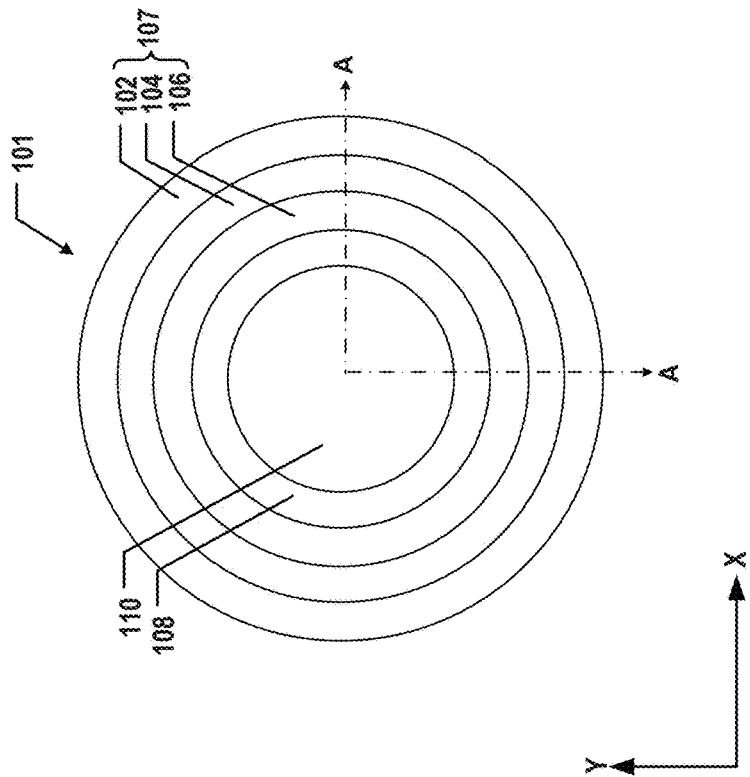

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cells that can be arranged vertically on a laterally-oriented substrate so that the number of memory cells can be scaled up in the vertical direction with respect to the substrate. As used herein, the term "vertical/vertically" means nominally perpendicular to the lateral surface of a substrate.

In conventional 3D NAND Flash memory devices, the memory cells are arranged in different planes of an array of circular channel structures. For example, FIG. 1 illustrates a plan view of a cross-section and a top perspective view of another cross-section in the AA plane of a 3D memory device 100 having a circular channel structure 101. Channel structure 101 extends vertically above a substrate (not shown) in the z-direction. It is noted that x- y-, and z-axes are included in FIG. 1 to further illustrate the spatial relationships of the components in 3D memory device 100. The x- and y-axes are orthogonal in the x-y plane, which is parallel to the wafer surface. The substrate includes two lateral surfaces extending laterally in the x-y plane (i.e., in the lateral direction): a top surface on the front side of the wafer, and a bottom surface on the backside opposite to the front side of the wafer. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device in the z-direction (the vertical direction perpendicular to the x-y plane) when the substrate is positioned in the lowest plane of the semiconductor device in the z-direction. The same notion for describing the spatial relationships is applied throughout the present disclosure.

3D memory device 100 also includes a memory stack 103 through which channel structure 101 extends vertically. Memory stack 103 includes multiple gate lines 112 in different planes in the z-direction abutting channel structure 101 to form multiple memory cells in different planes. Each gate line 112 extends laterally (e.g., in the x-direction) to become the word lines of 3D memory device 100. Memory stack 103 also includes multiple gate-to-gate dielectric layers (not shown) between adjacent gate lines 112. In other words, memory stack 103 includes interleaved gate lines 112 and gate-to-gate dielectric layers. Circular channel structure 101 includes concentric circles forming a memory film 107, a semiconductor channel 108, and a capping layer 110 from outside to inside in the plan view. Memory film 107 includes a blocking layer 102, a charge trapping layer 104, and a tunneling layer 106 from outside to inside in the plan view. Each gate line 112 and corresponding parts of blocking layer 102, charge trapping layer 104, tunneling layer 106, and semiconductor channel 108 in the same plane form a respective memory cell.

In this design, the memory cell density can be increased by increasing the density of channel structures 101 in the x-y plane and the number of gate lines 112 in the z-direction (e.g., the number of levels/layers of memory stack 103), while the number of memory cells of each channel structure 101 in the same plane is fixed, i.e., only one memory cell. However, as the number of cell layers/memory stack levels keeps increasing, e.g., exceeding 96, managing the fundamental trade-offs among etch profile control, size uniformity, and productivity is becoming increasingly challenging. For example, issues, such as channel hole step etching and interconnects for channel hole double pattern, have encountered significant challenges due to the increased channel structure density and/or memory stack level.

Various embodiments in accordance with the present disclosure provide 3D memory devices with channel structures having a plum blossom shape to increase the memory cell density without increasing the channel structure density or the memory stack level. The plum blossom shape can have more than two petals (e.g., 3, 4, 5, etc.) in which separate semiconductor channels are formed, respectively, such that in the same plane, more than two memory cells can be formed for each channel structure having the plum blossom shape. Due to the "angle effect," the thickness of a thin film deposited along the sidewalls of a channel hole having a plum blossom shape can become larger at each apex than at the edges of the plum blossom shape. By utilizing the thin film thickness distribution caused by the angle effect, a semiconductor channel-splitting process can separate a continuous semiconductor channel layer into multiple discrete semiconductor channels either with or without an etch stop layer. As a result, the memory cell density per unit area in the same plane can be increased to resolve various issues described above, such as channel hole step etching and interconnects for channel hole double pattern.

In some embodiments, the semiconductor channel-splitting process involves oxidizing parts of a protection layer (e.g., a silicon nitride film), followed by wet etching the oxidized parts at the edges selective to the non-oxidized parts of the protection layer at the apices of the plum blossom shape. A semiconductor layer channel (e.g., a polysilicon film) can then be split into separate semiconductor channels after wet etching using the remainders of the protection layer as the etch mask/etch stop layer. The oxidization process (e.g., in-situ steam generation (ISSG) oxidation) and selective wet etching process can be more easily controlled, thereby better controlling the thickness profile of the remainders of the protection layer as the etch mask/etch stop layer. In some embodiments, separate channel plugs are formed in the upper end of the channel structure, for example, above and in contact with the separate semiconductor channels, respectively, to increase the contact areas for landing the bit line contacts on the upper end of the channel structure, thereby increasing the process window for bit line contacts. The channel plugs can be formed by etching back the top portions of the remainders of the protection layer, followed by depositing the same semiconductor material of the semiconductor channels, such as polysilicon.

Figure 2A:
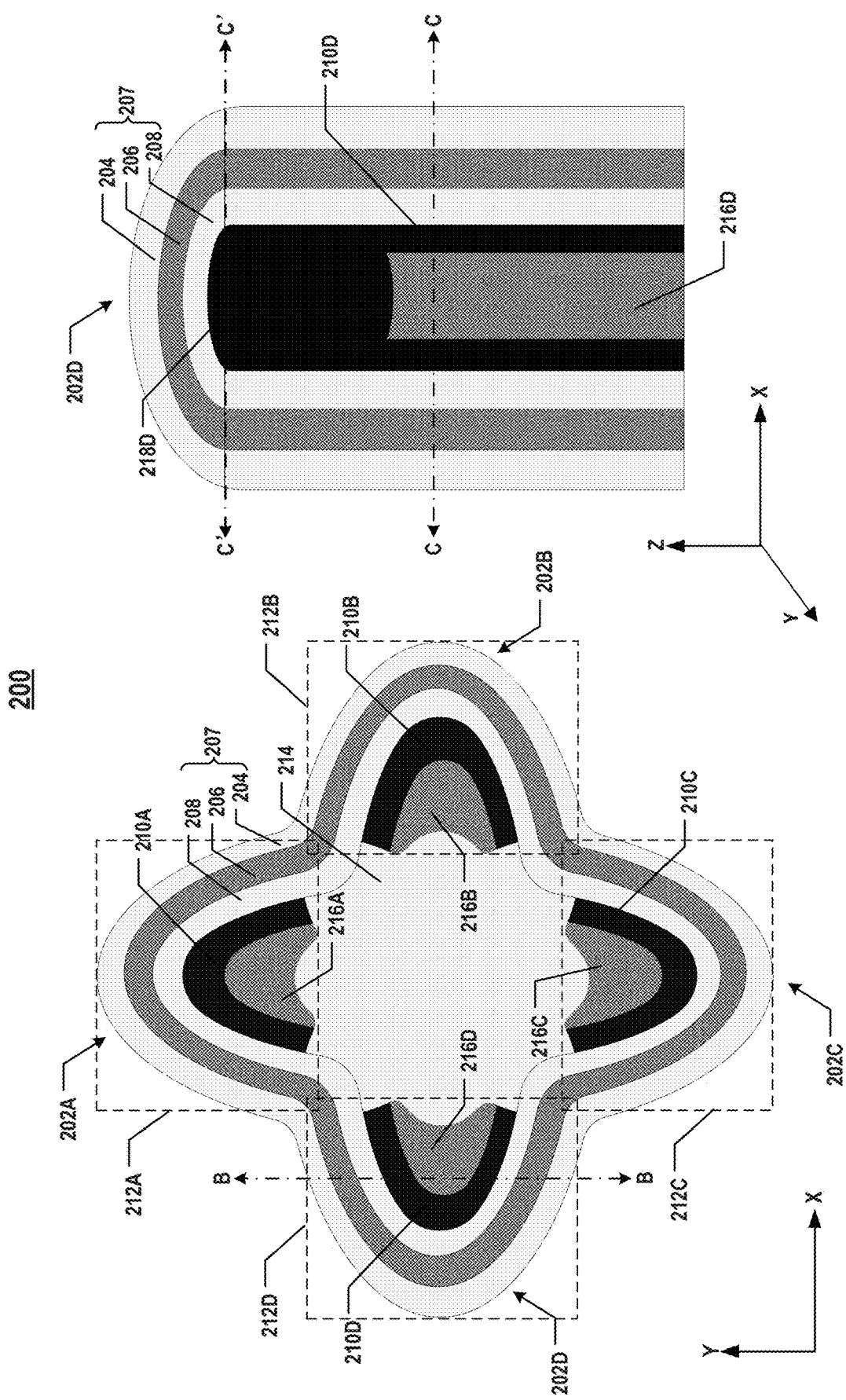
FIGS. 2A and 2B illustrate a top perspective view of a cross-section and plan views of cross-sections of an exemplary channel structure having a plum blossom shape, according to some embodiments of the present disclosure.
Figure 2B:
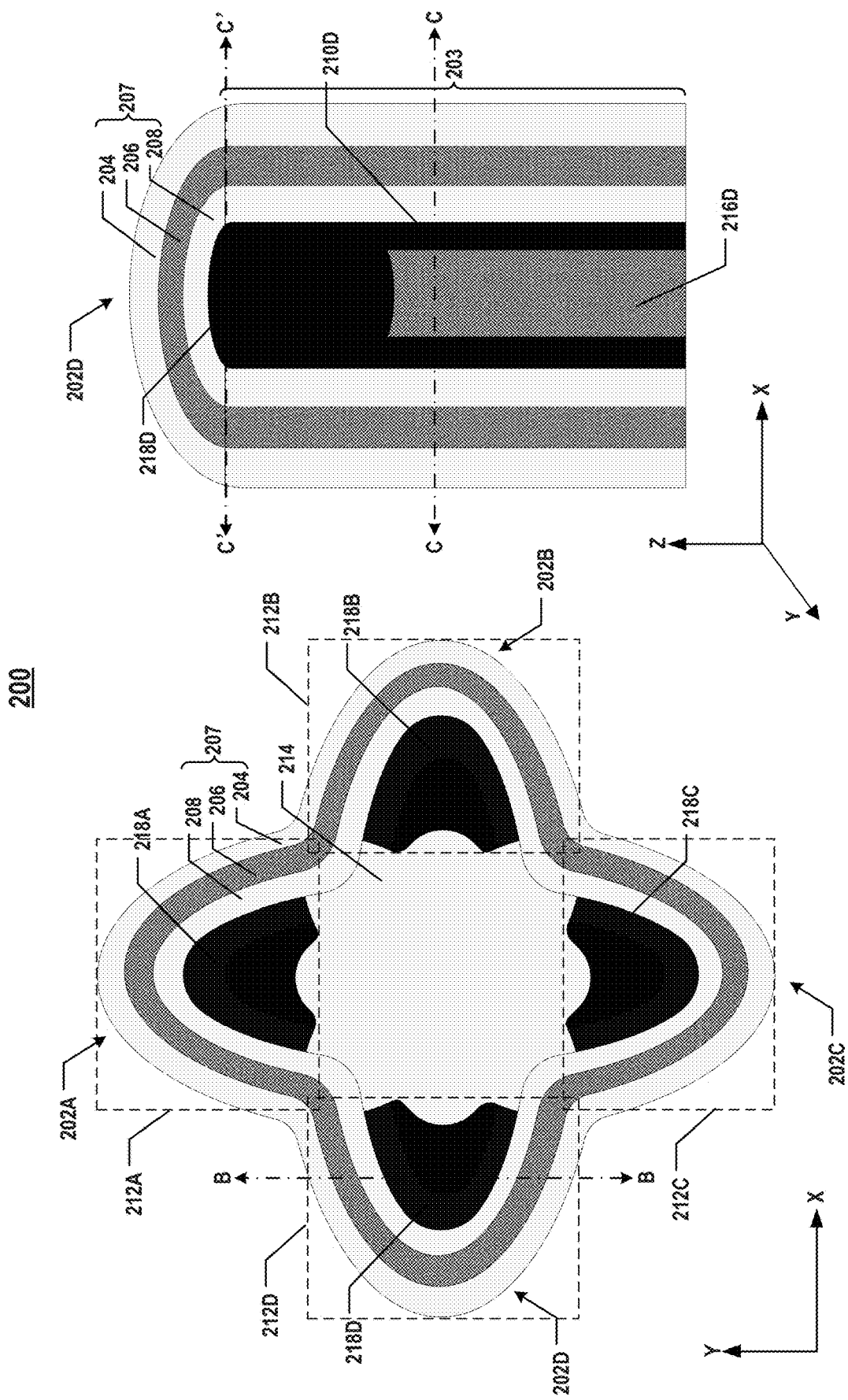

FIGS. 2A and 2B illustrate a top perspective view of a cross-section and plan views of cross-sections of an exemplary channel structure 200 having a plum blossom shape, according to some embodiments of the present disclosure. In some embodiments, each of FIGS. 2A and 2B shows the top perspective view of the cross-section in the BB plane of channel structure 200, FIG. 2A shows the plan view of the cross-section in the CC plane of channel structure 200, and FIG. 2B shows the plan view of the top surface or the cross-section in the C'C' plane of channel structure 200. It is understood that although not shown in FIGS. 2A and 2B, the substrate and memory stack 103 having interleaved gate lines 112 and gate-to-gate dielectric layers described above with respect to 3D memory device 100 in FIG. 1 may be similarly applied to a 3D memory device having channel structure 200. For example, a 3D memory device may include a memory stack having interleaved gate lines (word lines) and gate-to-gate dielectric layers above a substrate, and an array of channel structures 200 each extending vertically through the memory stack above the substrate and having a plum blossom shape as described below in detail. The substrate (not shown) can include silicon (e.g., single crystalline silicon), silicon germanium (SiGe), gallium arsenide (GaAs), germanium (Ge), silicon on insulator (SOI), or any other suitable materials. In some embodiments, the substrate is a thinned substrate (e.g., a semiconductor layer), which was thinned from a normal thickness by grinding, wet/dry etching, chemical mechanical polishing (CMP), or any combination thereof.

As shown in FIGS. 2A and 2B, different from the conventional circular channel structures, channel structure 200 has a plum blossom shape, which has four petals 202A, 202B, 202C, and 202D in the plan view, according to some embodiments. In some embodiments, each petal 202A, 202B, 202C, or 202D has nominally the same size and shape. In some embodiments, adjacent petals 202A, 202B, 202C, and 202D are tilted by nominally the same angle, for example, 90°. The plum blossom shape can have four apices in a respective petal 202A, 202B, 202C, or 202D. Each apex of respective petal 202A, 202B, 202C, or 202D of the plum blossom shape can be curved, as shown in FIGS. 2A and 2B. It is understood that in some examples, each apex may be in any other suitable shape as well. The plum blossom shape can also include edges connecting the apices. In other words, each apex is a convex corner where two edges meet, according to some embodiments.

Channel structure 200 can include a memory film 207 following the plum blossom shape and formed along the sidewalls of the channel hole of channel structure 200. In some embodiments, a memory film 207 is a composite dielectric layer including a blocking layer 204, a charge trapping layer 206, and a tunneling layer 208 from outside to inside in this order in the plan view. In some embodiments, each of blocking layer 204, charge trapping layer 206, and tunneling layer 208 is a continuous layer following the plum blossom shape. The thickness (in the x-y plane) of each of blocking layer 204, charge trapping layer 206, and tunneling layer 208 is nominally uniform in the plan view, according to some embodiments. That is, blocking layer 204 can have a nominally uniform thickness, charge trapping layer 206 can have a nominally uniform thickness, and tunneling layer 208 can have a nominally uniform thickness. It is understood that the thicknesses of blocking layer 204, charge trapping layer 206, and tunneling layer 208 may be nominally the same or different in different examples.

Blocking layer 204 (also known as "blocking oxide") can be formed along the sidewalls of the channel hole and can include silicon oxide, silicon oxynitride, high dielectric constant (high-k) dielectrics, or any combination thereof. In some embodiments, a gate dielectric layer (not shown) is disposed laterally between blocking layer 204 and the gate lines (not shown) or is part of the gate lines in contact with blocking layer 204. For example, the gate dielectric layer may include high-k dielectrics including, but not limited to, aluminum oxide ($Al_2O_3$), hafnium oxide ($HfO_2$), zirconium oxide ($ZnO_2$), tantalum oxide ($Ta_2O_5$), etc.

Charge trapping layer 206 (also known as "storage nitride") can be formed over blocking layer 204, for example, a continuous layer in contact with the entire inside surface of blocking layer 204. In some embodiments, charge trapping layer 206 stores charges, for example, electrons or holes from semiconductor channels 210A, 210B, 210C, and 210D. The storage or removal of charge in charge trapping layer 206 can impact the on/off state and/or the conductance of semiconductor channels 210A, 210B, 210C, and 210D. Charge trapping layer 206 can include silicon nitride, silicon oxynitride, silicon, or any combination thereof.

Tunneling layer 208 (also known as "tunnel oxide") can be formed over charge trapping layer 206, for example, a continuous layer in contact with the entire inside surface of charge trapping layer 206. Charge trapping layer 206 can be sandwiched between two continuous layers: blocking layer 204 and tunneling layer 208 in the x-y plane. Charges, for example, electrons or holes from semiconductor channels 210A, 210B, 210C, and 210D can tunnel through tunneling layer 208 to charge trapping layer 206. Tunneling layer 208 can include silicon oxide, silicon oxynitride, or any combination thereof. In some embodiments, blocking layer 204 includes silicon oxide, charge trapping layer 206 includes silicon nitride, and tunneling layer 208 includes silicon oxide. Memory film 207 thus may be referred to as an "ONO" memory film for charge trapping-type of 3D NAND Flash memory.

As shown in FIG. 2A, channel structure 200 further includes four semiconductor channels 210A, 210B, 210C, and 210D in four petals 202A, 202B, 202C, and 202D respectively, according to some embodiments. In some embodiments, semiconductor channels 210A, 210B, 210C, and 210D are separated from one another. Each semiconductor channel 210A, 210B, 210C, or 210D can be disposed over part of tunneling layer 208 at a respective apex in petal 202A, 202B, 202C, or 202D of the plum blossom shape. That is, each semiconductor channel 210A, 210B, 210C, or 210D is disconnected from other semiconductor channels 210A, 210B, 210C, and 210D at the edges of the plum blossom shape, according to some embodiments. It is understood that in some examples, semiconductor channel 210A, 210B, 210C, or 210D may extend laterally from the apex to the edges of the plum blossom shape, but still be separated from other semiconductor channels 210A, 210B, 210C, and 210D by a distance at the edges of the plum blossom shape.

Each semiconductor channel 210A, 210B, 210C, or 210D can provide charges, for example, electrons or holes, to charge trap layer 206, tunneling through tunneling layer 208. Each semiconductor channel 210A, 210B, 210C, or 210D can include silicon, such as amorphous silicon, polysilicon, or single crystalline silicon. In some embodiments, each semiconductor channel 210A, 210B, 210C, or 210D includes polysilicon. As shown in FIG. 2A, the thickness (in the x-y plane) of each semiconductor channels 210A, 210B, 210C, or 210D is nominally uniform in the plan view, according to some embodiments. The thickness of each semiconductor channel 210A, 210B, 210C, or 210D can be between about 10 nm and about 15 nm, such as between 10 nm and 15 nm (e.g., 10 nm, 10.5 nm, 11 nm, 11.5 nm, 12 nm, 12.5 nm, 13 nm, 13.5 nm, 14 nm, 14.5 nm, 15 nm, any range bounded by the lower end by any of these values, or in any range defined by any two of these values).

By separating a continuous semiconductor channel (e.g., 108 in FIG. 1) into separate semiconductor channels 210A, 210B, 210C, and 210D at different apices (e.g., in petals 202A, 202B, 202C, and 202D, respectively) of the plum blossom shape of channel structure 200, channel structure 200 in FIGS. 2A and 2B includes four memory cells 212A, 212B, 212C, and 212D in the same plane in the plan view, thereby increasing the memory cell density. Each memory cell 212A, 212B, 212C, or 212D corresponds to a respective one of petals 202A, 202B, 202C, and 202D, according to some embodiments. Like petals 202A, 202B, 202C, and 202D, each memory cell 212A, 212B, 212C, or 212D can have nominally the same size and shape, and adjacent memory cells 212A, 212B, 212C, and 212D can be tilted by nominally the same angle, e.g., 90° in FIGS. 2A and 2B. Each memory cell 212A, 212B, 212C, or 212D can include a respective separate semiconductor channel 210A, 210B, 210C, or 210D and four memory cells 212A, 212B, 212C, and 212D share continuous blocking layer 204, continuous charge trapping layer 206, and continuous tunneling layer 208 from outside to inside in this order in the plan view. For example, memory cell 212A may include semiconductor channel 210A and parts of blocking layer 204, charge trapping layer 206, and tunneling layer 208 in petal 202A. Similarly, memory cell 212B may include semiconductor channel 210B and parts of blocking layer 204, charge trapping layer 206, and tunneling layer 208 in petal 202B; memory cell 212C may include semiconductor channel 210C and parts of blocking layer 204, charge trapping layer 206, and tunneling layer 208 in petal 202C; memory cell 212D may include semiconductor channel 210D and parts of blocking layer 204, charge trapping layer 206, and tunneling layer 208 in petal 202D. Each memory cell 212A, 212B, 212C, or 212D can be be electrically connected to a respective gate line (not shown). It is understood that in some examples, memory cells 212A, 212B, 212C, and 212D may be electrically connected to the same gate line (not shown).

In some embodiments, as shown in FIG. 2A, channel structure 200 also includes four petal capping layers 216A, 216B, 216C, and 216D in four petals 202A, 202B, 202C, and 202D respectively, according to some embodiments. In some embodiments, petal capping layers 216A, 216B, 216C, and 216D are separated from one another, like semiconductor channels 210A, 210B, 210C, and 210D. Each petal capping layer 216A, 216B, 216C, or 216D can be disposed over a respective one of semiconductor channels 210A, 210B, 210C, and 210D at a respective apex in petal 202A, 202B, 202C, or 202D of the plum blossom shape. That is, each petal capping layer 216A, 216B, 216C, or 216D is disconnected from others petal capping layer 216A, 216B, 216C, and 216D at the edges of the plum blossom shape, according to some embodiments. In some embodiments, the thickness of each petal capping layer 216A, 216B, 216C, or 216D is nonuniform in the plan view. For example, the thickness of each petal capping layer 216A, 216B, 216C, or 216D may be greater in the middle and gradually decrease towards the edges thereof. Each petal capping layer 216A, 216B, 216C, or 216D can include dielectrics, such as silicon nitride. As described below with respect to the fabrication process, petal capping layers 216A, 216B, 216C, and 216D may be the remainders (e.g., unoxidized parts) of a protection layer (e.g., a silicon nitride layer), which function as the etch mask/stop layer when splitting separate semiconductor channels 210A, 210B, 210C, and 210D from a continuous semiconductor channel layer.

In some embodiments, channel structure 200 further includes a continuous core capping layer 214 filling the remaining space of channel structure 200. Core capping layer 214 is in the middle (core) of channel structure 200 and is surrounded by tunneling layer 208 and petal capping layers 216A, 216B, 216C, and 216D in the plan view, according to some embodiments. Core capping layer 214 can include dielectrics, such as silicon oxide. Both core capping layer 214 and petal capping layers 216A, 216B, 216C, and 216D can provide mechanical supports to channel structure 200. In some embodiments, core capping layer 214 and each petal capping layer 216A, 216B, 216C, or 216D include different dielectric materials, such as silicon oxide in core capping layer 214 and silicon nitride in petal capping layer 216A, 216B, 216C, or 216D. As a result, in some cases in which parts of memory film 207 are removed (e.g., at the edges of the plum blossom shape), core capping layer 214 can protect petal capping layers 216A, 216B, 216C, and 216D for etching, thereby providing better mechanical supports to channel structure 200. It is understood that in some examples, part of core capping layer 214 may be replaced with an air gap within core capping layer 214. That is, the remaining space of channel structure 200 may be partially filled with core capping layer 214 in some examples.

In some embodiments, as shown in FIG. 2B, channel structure 200 further includes four channel plugs 218A, 218B, 218C, and 218D in four petals 202A, 202B, 202C, and 202D, respectively, according to some embodiments. In some embodiments, channel plugs 218A, 218B, 218C, and 218D are separated from one another. Each channel plug 218A, 218B, 218C, or 218D can be laterally disposed over part of tunneling layer 208 at a respective apex in petal 202A, 202B, 202C, or 202D of the plum blossom shape. That is, each channel plug 218A, 218B, 218C, or 218D is disconnected from others channel plugs 218A, 218B, 218C, and 218D at the edges of the plum blossom shape, according to some embodiments. In some embodiments, the thickness of each channel plug 218A, 218B, 218C, or 218D is non-uniform in the plan view. For example, the thickness of each channel plug 218A, 218B, 218C, or 218D may be greater in the middle and gradually decrease towards the edges thereof.

Each channel plug 218A, 218B, 218C, or 218D can be laterally aligned with a respective semiconductor channel 210A, 210B, 210C, or 210D and a respective petal capping layer 216A, 216B, 216C, or 216D in a respective petal 202A, 202B, 202C, or 202D of the plum blossom shape. That is, each channel plug 218A, 218B, 218C, or 218D matches the combination of a respective semiconductor channel 210A, 210B, 210C, or 210D and a respective petal capping layer 216A, 216B, 216C, or 216D underneath in the same petal 202A, 202B, 202C, or 202D, for example, by having the same size and shape, according to some embodiments. In some embodiments, in each petal 202A, 202B, 202C, or 202D, the lateral dimension of channel plug 218A, 218B, 218C, or 218D is greater than the lateral dimension of semiconductor channel 210A, 210B, 210C, or 210D. For example, the size of channel plug 218A, 218B, 218C, or 218D in the top portion of channel structure 200 is greater than that of semiconductor channel 210A, 210B, 210C, or 210D underneath, thereby increasing the contact area and process window for landing bit line contacts on the top surface of channel structure 200. In some embodiments, four separate bit line contacts (not shown) are disposed above and in contact with separate channel plug 218A, 218B, 218C, and 218D, respectively. In some embodiments, channel plug 218A, 218B, 218C, or 218D also functions as part of the drain of a respective 3D NAND memory string. Although not shown, it is understood that in some examples, each channel plug 218A, 218B, 218C, or 218D can further extend outwards laterally to be also aligned with parts of tunneling layer 208 in a respective petal 202A, 202B, 202C, or 202D of the plum blossom shape or to be also aligned with parts of tunneling layer 208 and charge trapping layer 206 in a respective petal 202A, 202B, 202C, or 202D of the plum blossom shape. In other words, each channel plug 218A, 218B, 218C, or 218D can be laterally disposed over part of charge trapping layer 206 at a respective apex in petal 202A, 202B, 202C, or 202D of the plum blossom shape or over part of blocking layer 204 at a respective apex in petal 202A, 202B, 202C, or 202D of the plum blossom shape.

Each channel plug 218A, 218B, 218C, or 218D can include semiconductors, such as polysilicon. In some embodiments, each channel plug 218A, 218B, 218C, or 218D and each semiconductor channel 210A, 210B, 210C, or 210D include the same semiconductor material, such as polysilicon. As a result, the boundary/interface between each semiconductor channel 210A, 210B, 210C, or 210D and a respective channel plug 218A, 218B, 218C, or 218D having the same material in the same petal 202A, 202B, 202C, or 202D may not be discerned in channel structure 200. As set forth herein, the boundary/interface between each semiconductor channel 210A, 210B, 210C, or 210D and a respective channel plug 218A, 218B, 218C, or 218D is coplanar with the top surface of a respective petal capping layer 216A, 216B, 216C, or 216D, as shown in the top perspective view in FIGS. 2A and 2B. Semiconductor channel 210A, 210B, 210C, or 210D and petal capping layer 216A, 216B, 216C, or 216D in a respective petal 202A, 202B, 202C, or 202D thus do not extend vertically along the entire depth of channel structure 200, according to some embodiments. In some embodiments, semiconductor channel 210A, 210B, 210C, or 210D and petal capping layer 216A, 216B, 216C, or 216D are coplanar with one another, and each semiconductor channel 210A, 210B, 210C, or 210D is disposed below and in contact with a respective one of channel plugs 218A, 218B, 218C, and 218D in the same petal 202A, 202B, 202C, or 202D of the plum blossom shape.

In some embodiments, the upper portion of channel structure 200 includes continuous blocking layer 204, continuous charge trapping layer 206, continuous tunneling layer 208, separate channel plugs 218A, 218B, 218C, and 218D, and continuous core capping layer 214 from outside to inside in this order at each apex of the plum blossom shape channel. In some embodiments, below channel plugs 218A, 218B, 218C, and 218D, channel structure 200 includes continuous blocking layer 204, continuous charge trapping layer 206, continuous tunneling layer 208, separate semiconductor channels 210A, 210B, 210C, and 210D, separate petal capping layers 216A, 216B, 216C, and 216D, and core capping layer 214 from outside to inside in this order at each apex of the plum blossom shape. In some embodiments, channel structure 200 includes continuous blocking layer 204, continuous charge trapping layer 206, continuous tunneling layer 208, and continuous core capping layer 214 from outside to inside in this order at the edges of the plum blossom shape.

Although not shown in FIGS. 2A and 2B, it is understood that any other suitable components may be included as part of the 3D memory device having channel structure 200. For example, local contacts, such as bit line contacts, word line contacts, and source line contacts, may be included in the 3D memory device for metal routing, i.e., electrically connecting memory cells 212A, 212B, 212C, and 212D to interconnects (e.g., middle-end-of-line (MEOL) interconnects and back-end-of-line (BEOL) interconnects). For example, each semiconductor channel 210A, 210B, 210C, or 210D may be metal routed using a bit line contact from the top surface through a respective channel plug 218A, 218B, 218C, or 218D, as described above. In some embodiments, the 3D memory device further includes peripheral circuits, such as any suitable digital, analog, and/or mixed-signal peripheral circuits used for facilitating the operation of memory cells 212A, 212B, 212C, and 212D. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

It is understood that although the number of petals 202A, 202B, 202C, and 202D and the number of semiconductor channels 210A, 210B, 210C, and 210D in FIGS. 2A and 2B is 4, the number of the petals and the corresponding semiconductor channels therein in channel structures having a plum blossom shape is not limited to 4 and may be any integer greater than 2, such as 3, 4, 5, etc.

Figure 3A:
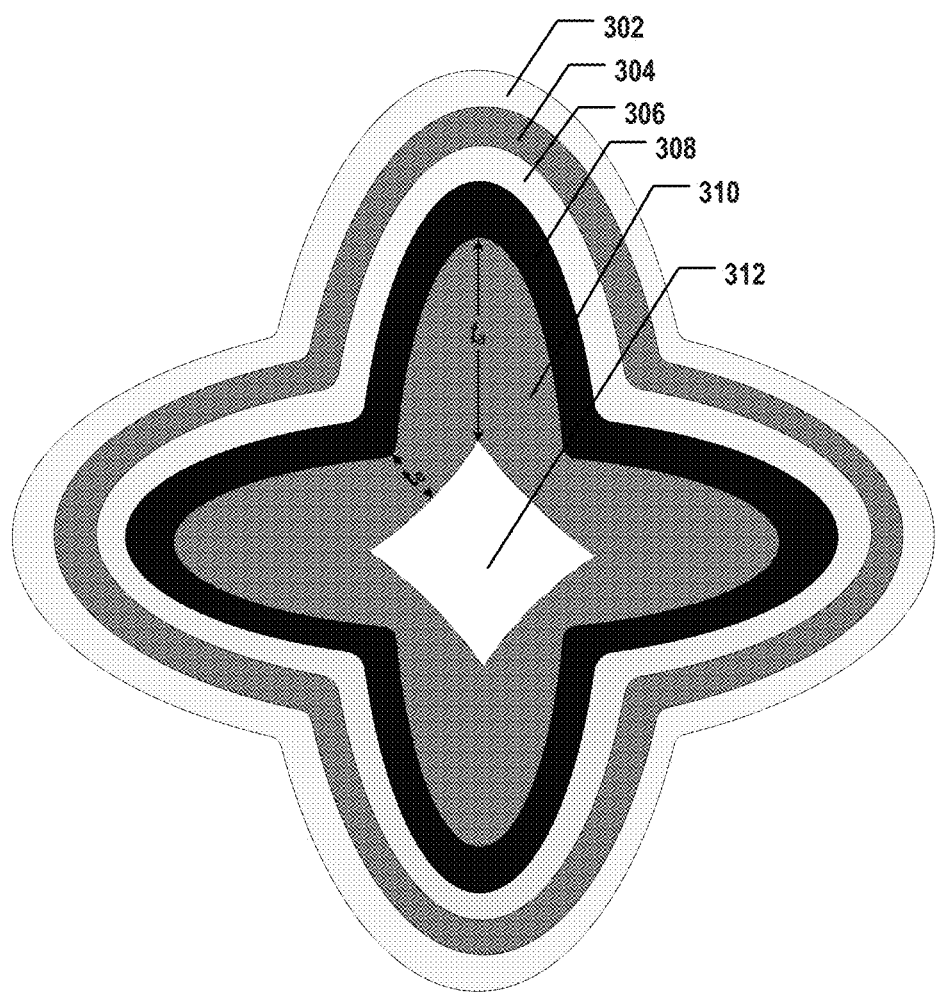
FIGS. 3A-3G illustrate an exemplary fabrication process for forming a channel structure having a plum blossom shape, according to some embodiments of the present disclosure.
Figure 3B:
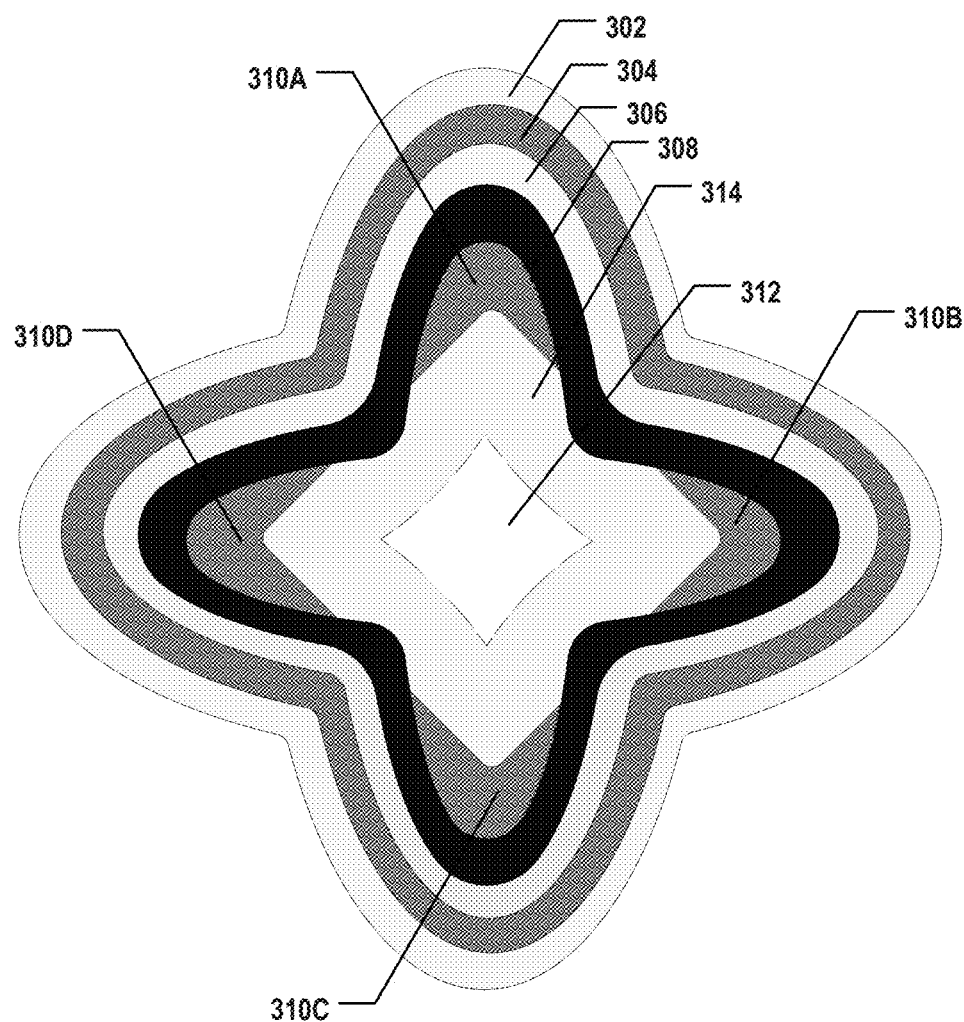
Figure 3C:
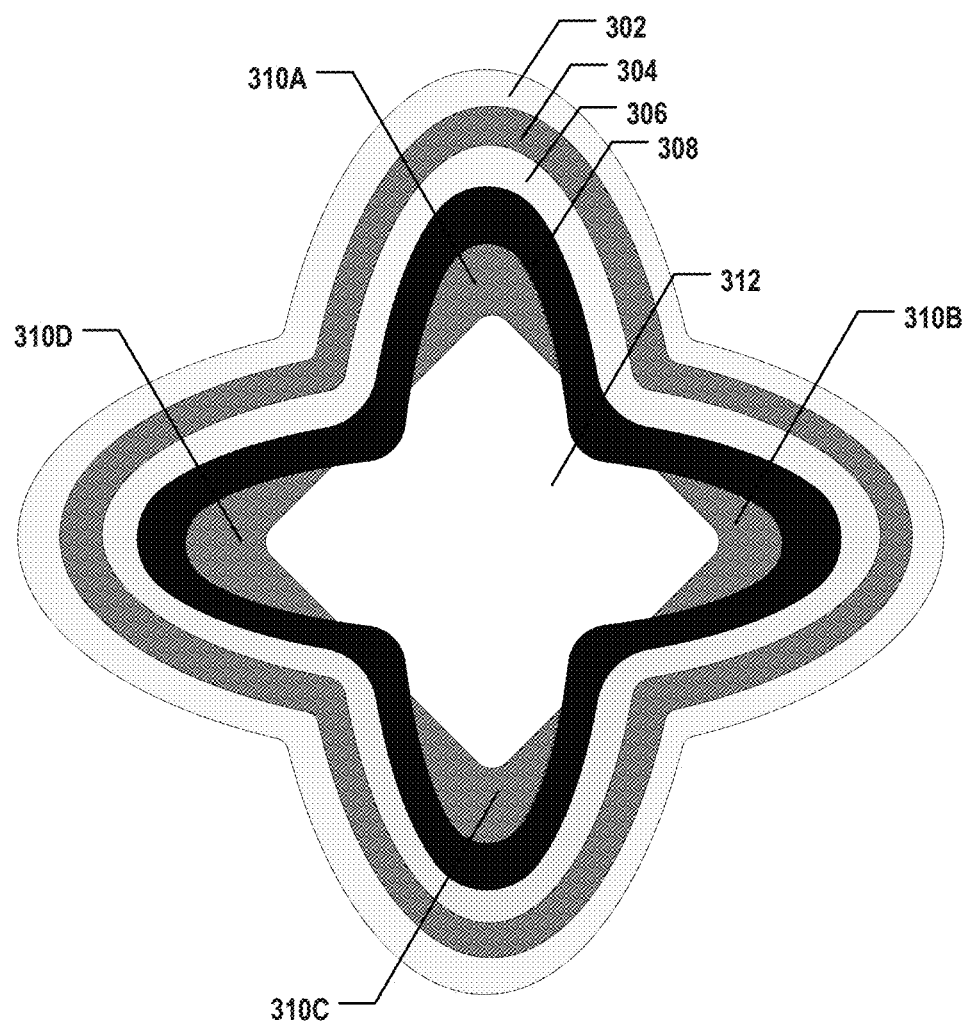
Figure 3C:
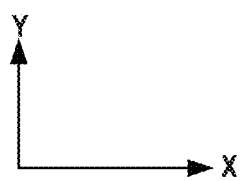
Figure 3D:
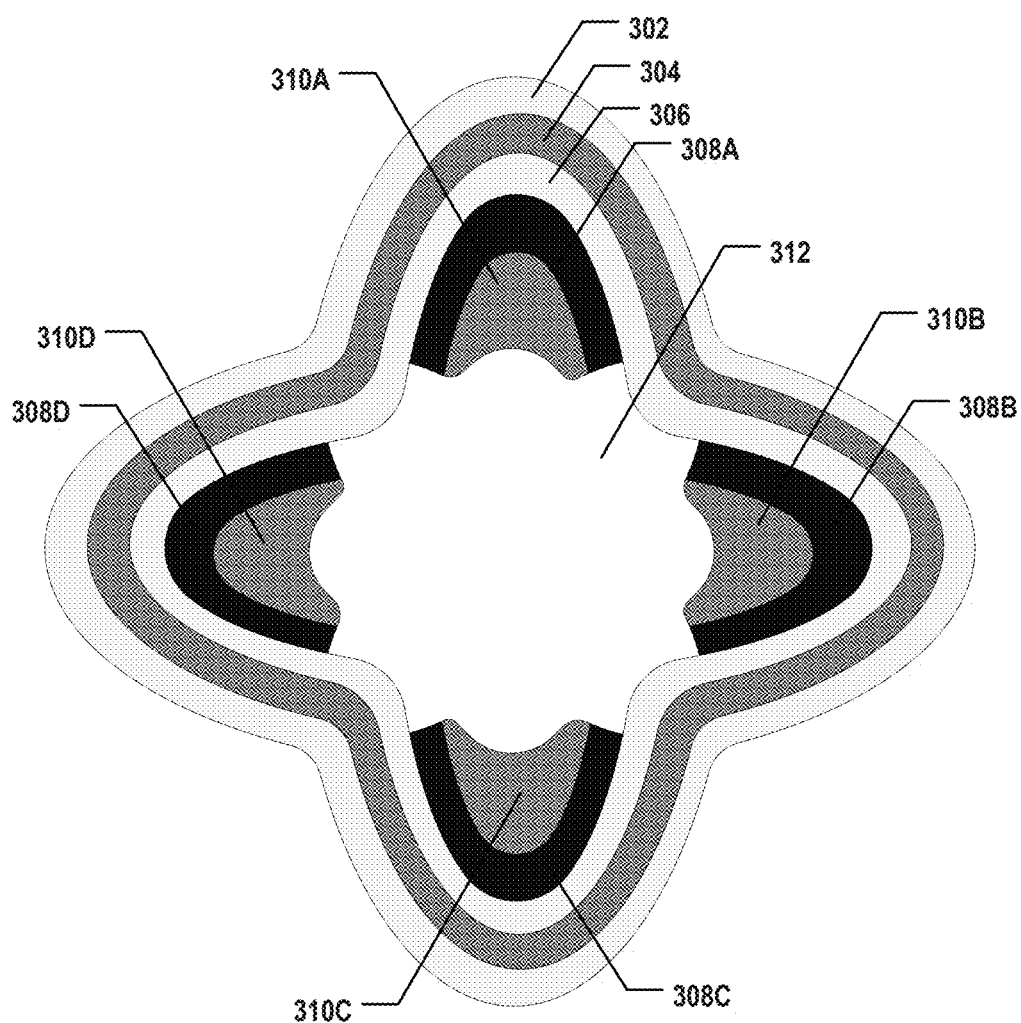
Figure 3D:
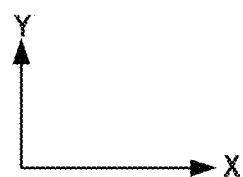
Figure 3E:
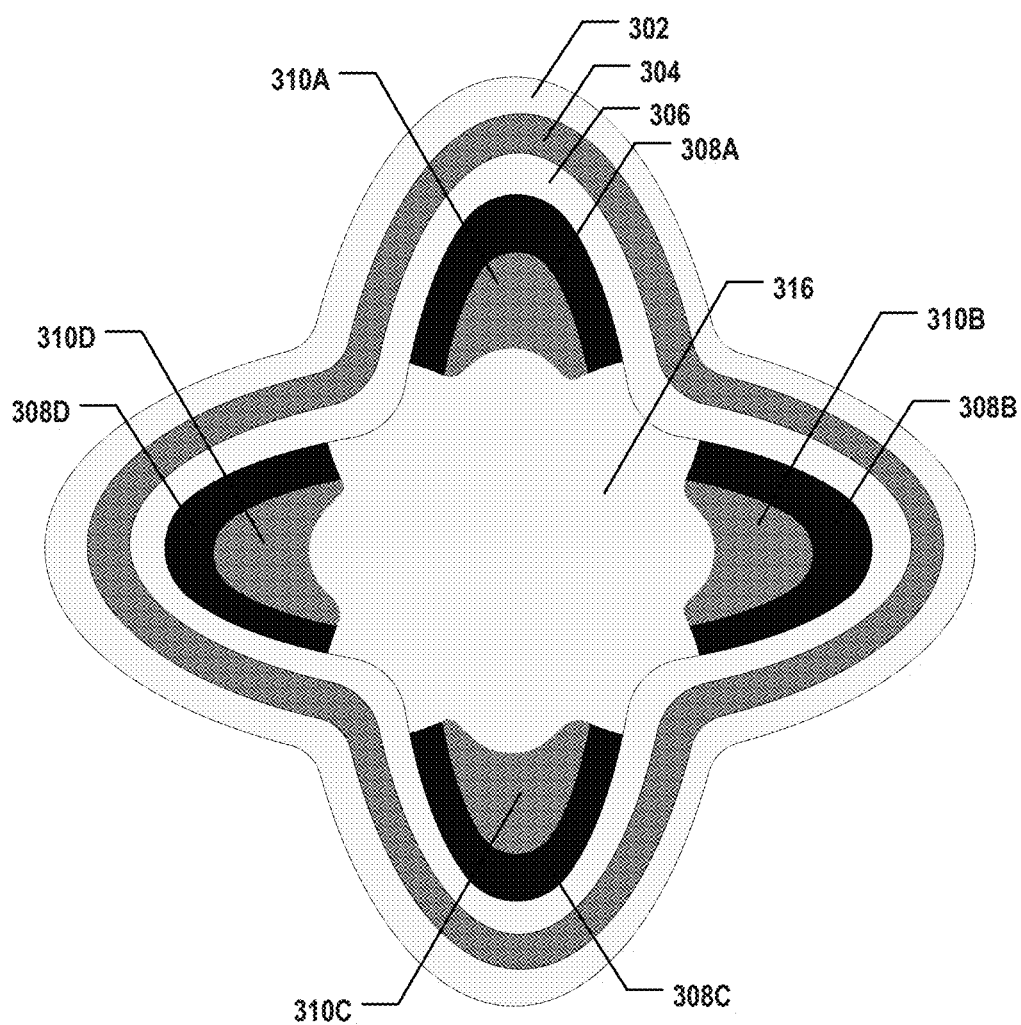
Figure 3F:
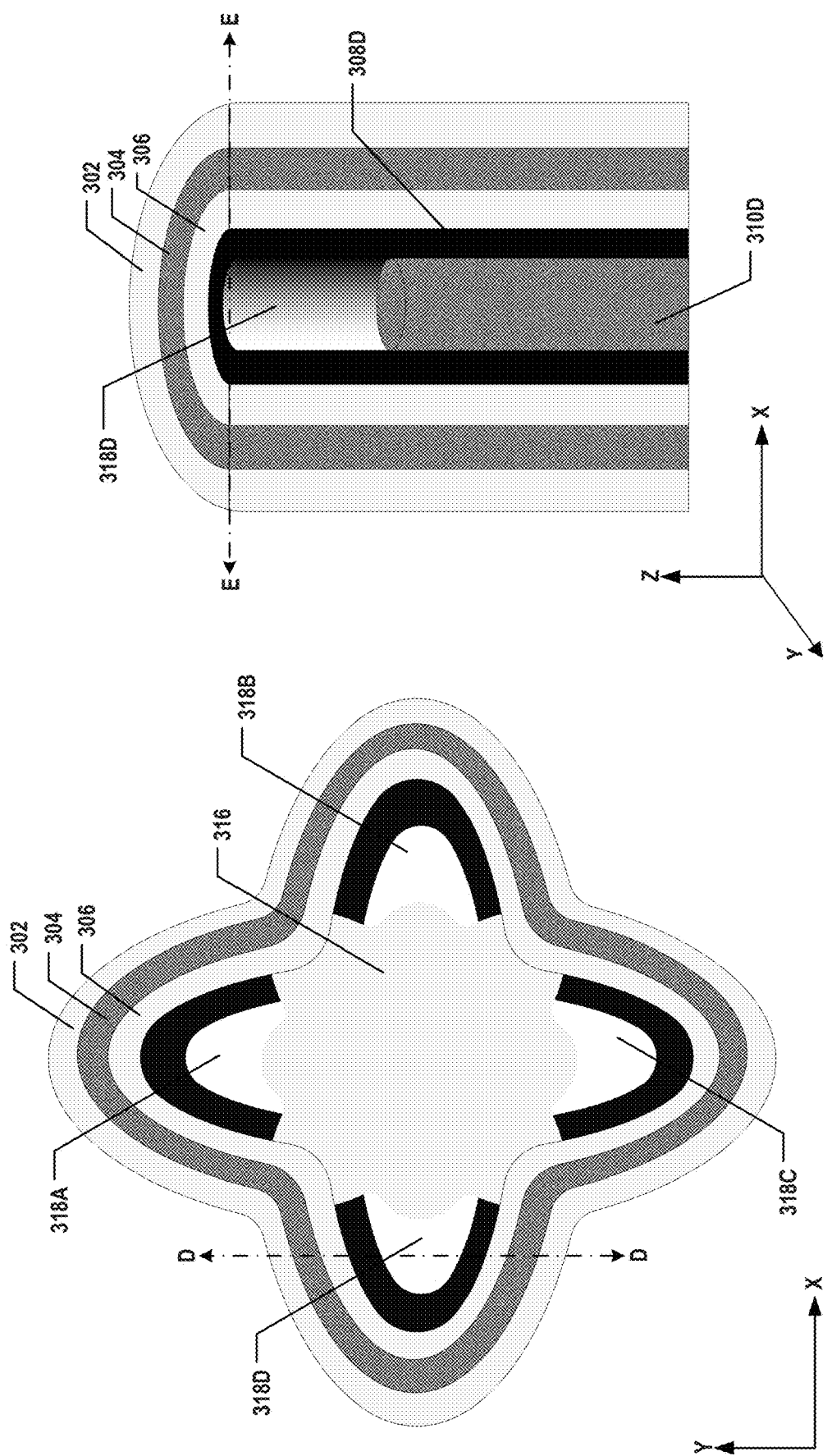
Figure 3G:
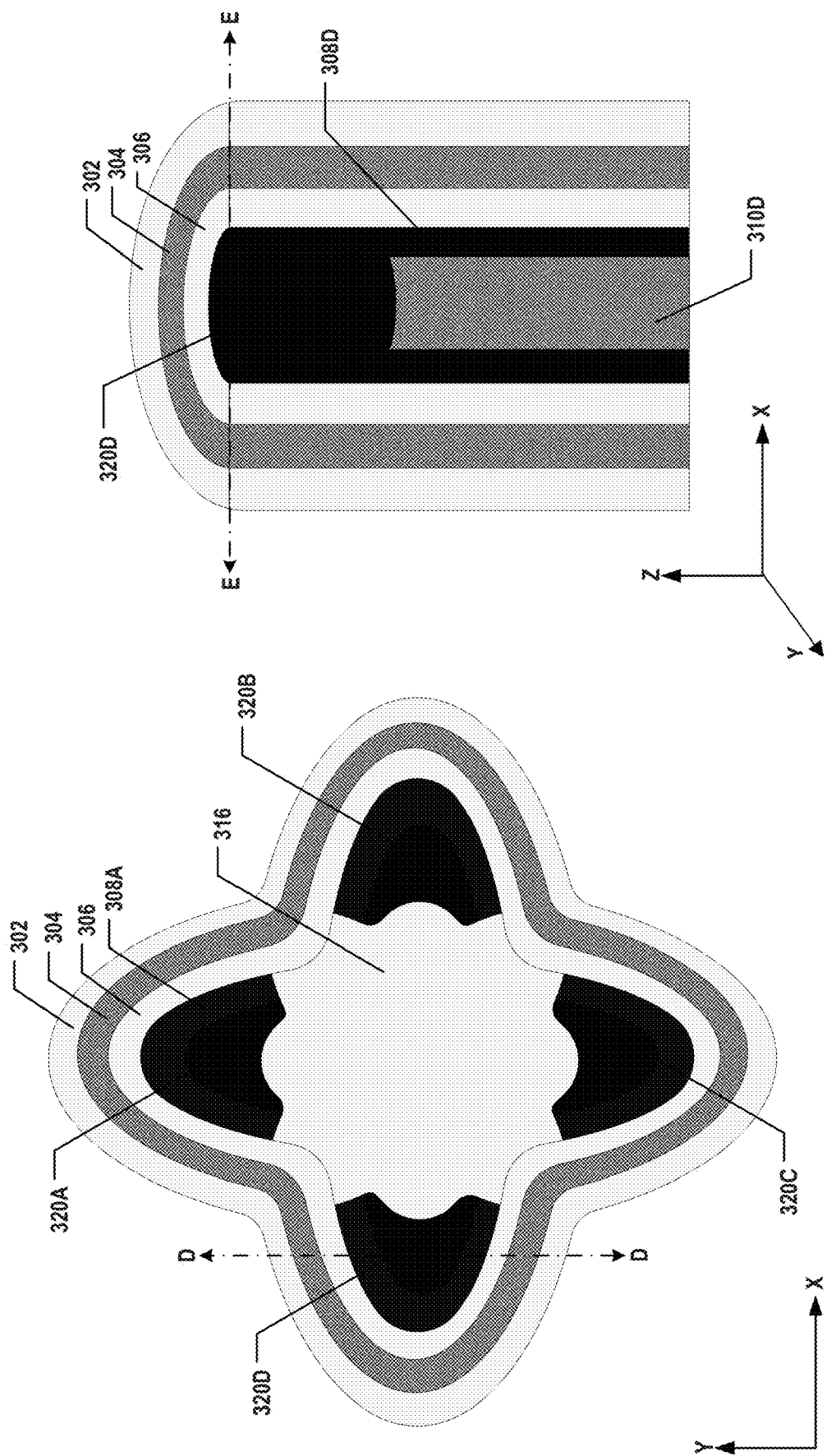
Figure 4:
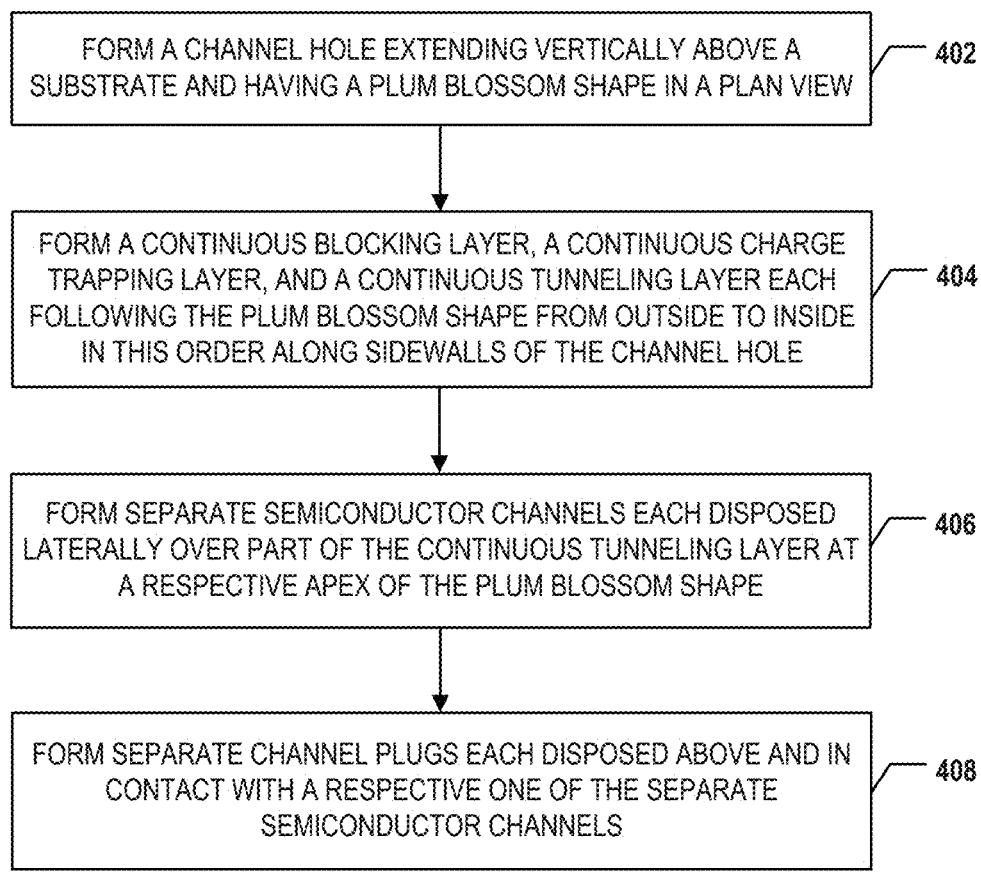
FIG. 4 is a flowchart of an exemplary method for forming a 3D memory device with a channel structure having a plum blossom shape, according to some embodiments.
Figure 5A:
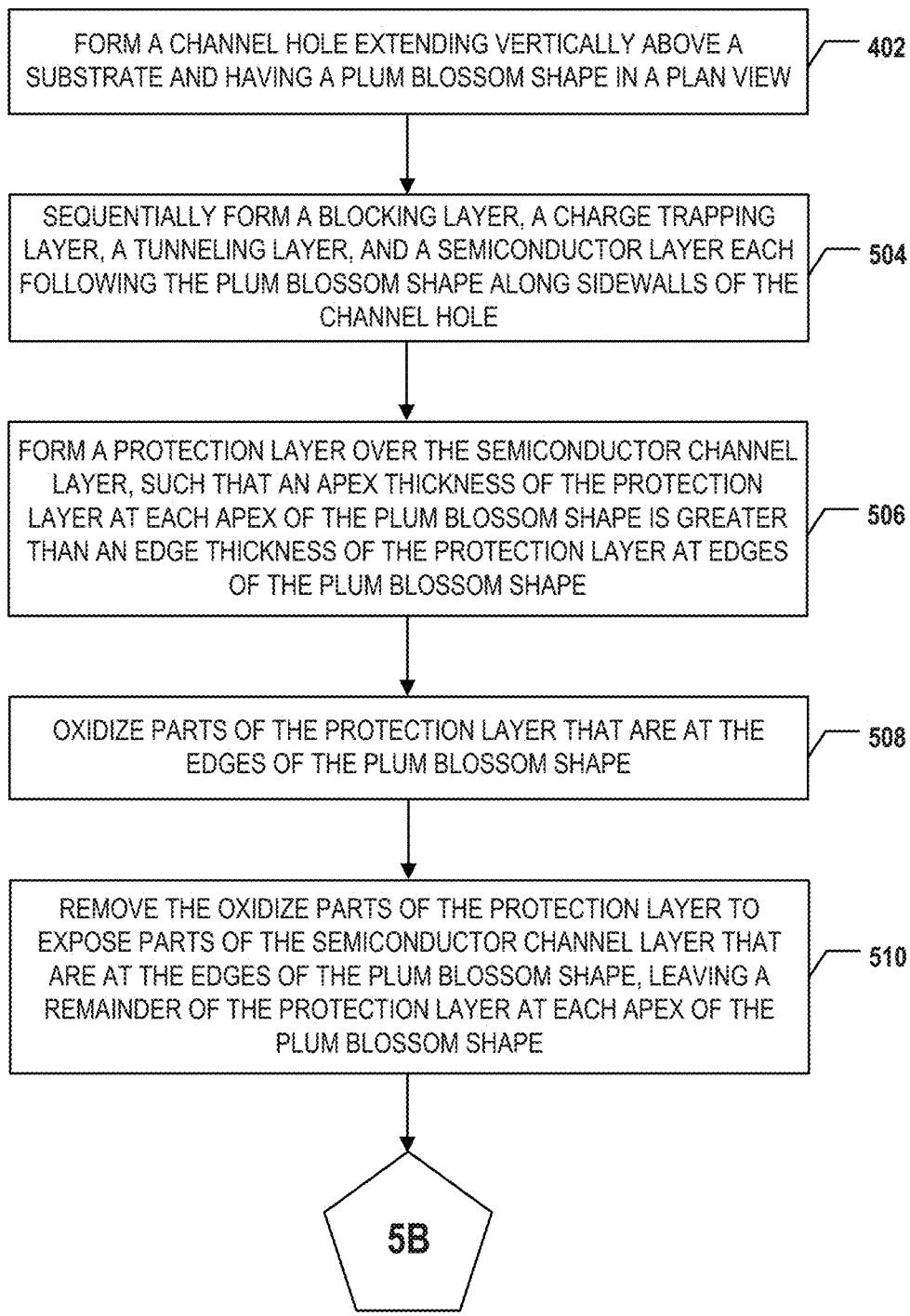
FIGS. 5A and 5B are a flowchart of another exemplary method for forming a 3D memory device with a channel structure having a plum blossom shape, according to some embodiments.
Figure 5B:
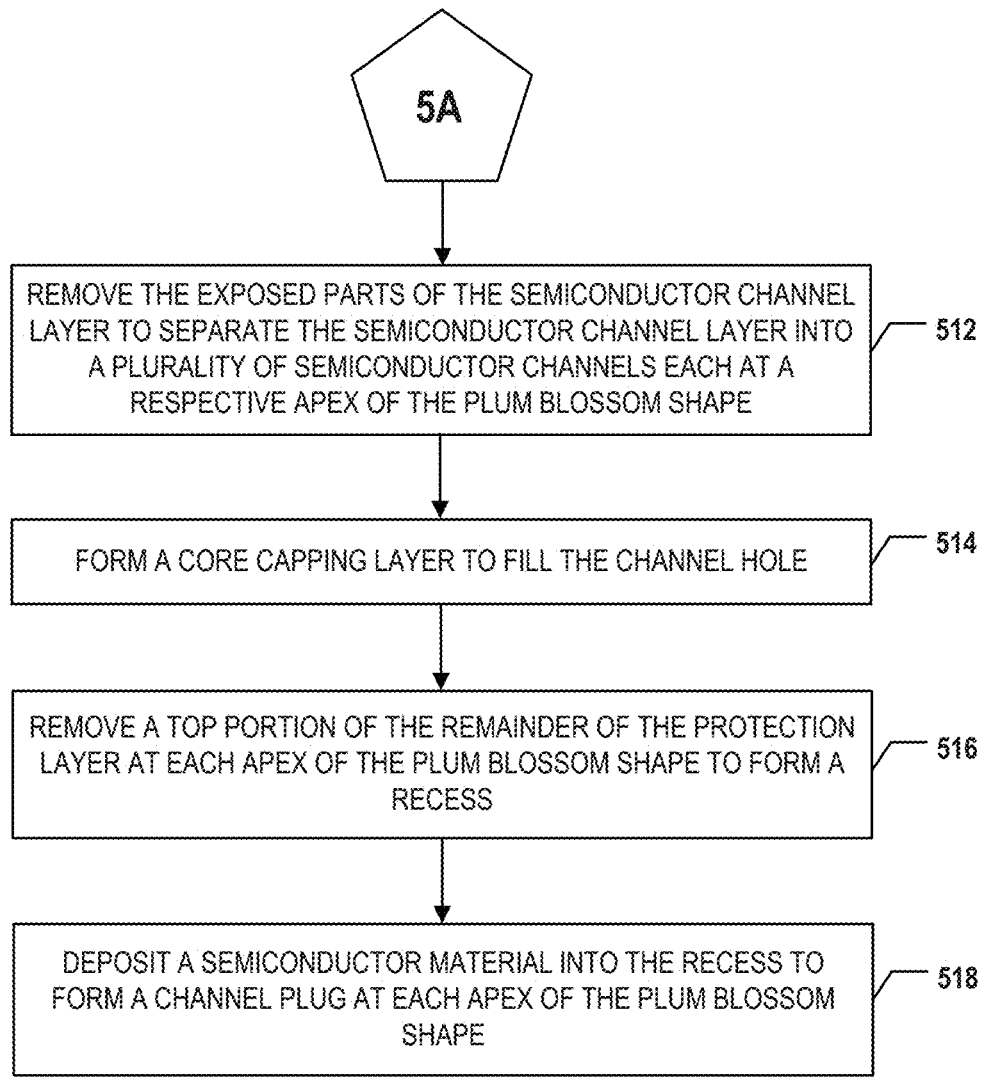

FIGS. 3A-3G illustrate an exemplary fabrication process for forming a channel structure having a plum blossom shape, according to some embodiments of the present disclosure. Each of FIGS. 3F and 3G illustrates a plan view of a cross-section in the EE plane of a respective intermediate structure in forming the channel structure as well as a top perspective view of another cross-section in the DD plane of the intermediate structure. FIG. 4 is a flowchart of an exemplary method 400 for forming a 3D memory device with a channel structure having a plum blossom shape, according to some embodiments. FIGS. 5A and 5B are a flowchart of another exemplary method 500 for forming a 3D memory device with a channel structure having a plum blossom shape, according to some embodiments. Examples of the 3D memory device depicted in FIGS. 3A-3G, 4, 5A, and 5B include a 3D memory device having channel structure 200 depicted in FIGS. 2A and 2B. FIGS. 3A-3G, 4, 5A, and 5B will be described together. It is understood that the operations shown in methods 400 and 500 are not exhaustive and that other operations can be performed as well before, after, or between any of the illustrated operations. Further, some of the operations may be performed simultaneously, or in a different order than shown in FIGS. 4, 5A, and 5B.

Referring to FIG. 4, method 400 starts at operation 402, in which a channel hole extending vertically above a substrate and having a plum blossom shape in a plan view is formed. In some embodiments, the plum blossom shape includes a plurality of petals. The number of the petals is greater than 2, according to some embodiments. The substrate can be a silicon substrate.

As illustrated in FIG. 3A, a channel hole extending vertically and having a plum blossom shape with four petals in the plan view is formed above a substrate (not shown). An etch mask (e.g., a soft etch mask and/or a hard etch mask) corresponding to the blossom shape of the channel hole can be patterned using lithography, development, and etching. The channel hole then can be etched with the etch mask through a stack structure, either a memory stack including interleaved conductive layers and dielectric layers or a dielectric stack including interleaved sacrificial layers and dielectric layers, using wet etching and/or dry etching, such as deep reactive ion etching (DRIE).

Method 400 proceeds to operation 404, as illustrated in FIG. 4, in which a continuous blocking layer, a continuous charge trapping layer, and a continuous tunneling layer each following the plum blossom shape are formed from outside to inside in this order along sidewalls of the channel hole. In some embodiments, as shown in FIG. 5A, at operation 504, a blocking layer, a charge trapping layer, a tunneling layer, and a semiconductor channel layer each following the plum blossom shape along sidewalls of the channel hole are sequentially formed. Each of the blocking layer, charge trapping layer, tunneling layer, and semiconductor channel layer can be a continuous layer. In some embodiments, to sequentially form the blocking layer, charge trapping layer, tunneling layer, and semiconductor channel layer, layers of silicon oxide, silicon nitride, silicon oxide, and polysilicon are sequentially deposited along the sidewalls of the channel hole. The deposition can include atomic layer deposition (ALD). In some embodiments, the thickness of each of the blocking layer, charge trapping layer, tunneling layer, and semiconductor channel layer is nominally uniform in the plan view.

As illustrated in FIG. 3A, a blocking layer 302, a charge trapping layer 304, a tunneling layer 306, and a semiconductor channel layer 308 are sequentially formed along sidewalls of the channel hole and thus, each follows the plum blossom shape of the channel hole in the plan view. In some embodiments, layers of dielectrics, such as a layer of silicon oxide, a layer of silicon nitride, and a layer of silicon oxide, are sequentially deposited along the sidewalls of the channel hole using one or more thin film deposition processes including, but not limited to, physical vapor deposition (PVD), chemical vapor deposition (CVD), ALD, or any combination thereof to form blocking layer 302, charge trapping layer 304, and tunneling layer 306. A layer of a semiconductor material, such as polysilicon, then can be deposited over the layer of silicon oxide (tunneling layer 306) using one or more thin film deposition processes including, but not limited to, PVD, CVD, ALD, or any combination thereof to form semiconductor channel layer 308. In some embodiments, a conformal coating process, such as ALD, is used to deposit each of blocking layer 302, charge trapping layer 304, tunneling layer 306, and semiconductor channel layer 308, such that each of blocking layer 302, charge trapping layer 304, tunneling layer 306, and semiconductor channel layer 308 can have a nominally uniform thickness in the x-y plane in the plan view. In some embodiments, the thickness of semiconductor channel layer 308 is controlled to be between about 10 nm and about 15 nm, such as between 10 nm and 15 nm, by controlling, for example, the deposition rate and/or time of the ALD.

Method 400 proceeds to operation 406, as illustrated in FIG. 4, in which a plurality of separate semiconductor channels each disposed laterally over part of the continuous tunneling layer at a respective apex of the plum blossom shape are formed. In some embodiments, as shown in FIG. 5A, at operation 506, a protection layer is formed over the semiconductor channel layer, such that an apex thickness of the protection layer at each apex of the plum blossom shape is greater than an edge thickness of the protection layer at edges of the plum blossom shape. In some embodiments, to form the protection layer, a layer of silicon nitride is deposited over the semiconductor channel layer using ALD without filling the channel hole.

As illustrated in FIG. 3A, a protection layer 310 is formed over semiconductor channel layer 308. The thickness of protection layer 310 varies between the apices and the edges of the plum blossom shape, according to some embodiments. In some embodiments, the apex thickness $t_o$ of protection layer 310 is greater than the edge thickness $t_e$. A layer of silicon nitride, or any other suitable materials that are different from the material of semiconductor channel layer 308 (e.g., polysilicon) and that can form native oxide thereof, can be deposited over semiconductor channel layer 308 using one or more thin film deposition processes including, but not limited to, PVD, CVD, ALD, or any combination thereof to form protection layer 310. In some embodiments, ALD is used to deposit protection layer 310 because of its ability to precisely control the thickness of the deposition. In each apex of the plum blossom shape, an "angle effect" can cause more deposited material accumulated at the corner where two edges meet. As a result, the thickness of protection layer 310 can become larger at each apex than at the edges. The thickness of protection layer 310 can be controlled, for example, by controlling the deposition rate and/or time of ALD to ensure the desired thickness distribution (e.g., $t_a > t_e$) while not filling the channel hole. That is, the total thickness of blocking layer 302, charge trapping layer 304, tunneling layer 306, semiconductor channel layer 308, and protection layer 310 may be controlled to leave a gap 312 in the middle of the channel hole, which can act as the passageway for future processes.

As shown in FIG. 5A, at operation 508, parts of the protection layer that are at the edges of the plum blossom shape are oxidized. The oxidation can include wet oxidation or chemical oxidation.

As illustrated in FIG. 3B, parts of protection layer 310 (shown in FIG. 3A) at the edges of the plum blossom shape are oxidized to form native oxide 314 at the edges of the plum blossom shape. In some embodiments in which protection layer 310 includes silicon nitride, native oxide 314 (the oxidized parts of protection layer 310) includes silicon oxide. It is understood that depending on the oxidization processes (e.g., the extent to which nitrogen atoms and ions are removed from the native oxide), native oxide 314 can be entirely silicon oxide, entirely silicon oxynitride, and a mixture of silicon oxide and silicon oxynitride. In some embodiments, the parts of protection layer 310 are oxidized by a thermal oxidation process. Either dry oxidation using molecular oxygen as the oxidant or wet oxidation using water vapor as the oxidant can be used to form the native oxide at a temperature, for example, not greater than about 850° C. For example, the thermal oxidation may include an ISSG process, which uses oxygen gas and hydrogen gas to create water in the form of steam. The thickness of the resulting native oxide 314 can be controlled by the thermal oxidation temperature and/or time. In some embodiments, the parts of protection layer 310 are oxidized by a wet chemical oxidation process, for example, including ozone. In some embodiments, the wet chemical is a mixture of hydrofluoric acid and ozone (e.g., FOM). The thickness of resulting native oxide 314 can be controlled by the wet chemical compositions, temperature, and/or time.

Due to the thickness difference between $t_a$ and $t_e$, the parts of protection layer 310 at the edges can be oxidized faster than the parts of protection layer 310 at the apices. As a result, by controlling the stop timing of the oxidization processes, remainder 310A, 310B, 310C, and 310D of protection layer 310 at each apex of the plum blossom shape can be formed from protection layer 310 (e.g., with a reduced thickness due to the oxidation). As shown in FIG. 3B, remainder 310A, 310B, 310C, and 310D of protection layer 310 are covered and separated by native oxide 314 of protection layer 310 at the edges of the plum blossom shape.

As shown in FIG. 5A, at operation 510, the oxidized parts of the protection layer are removed to expose parts of the semiconductor channel layer that are at the edges of the plum blossom shape, leaving a remainder of the protection layer at each apex of the plum blossom shape. In some embodiments, to remove the oxidized parts of the protection layer, the oxidized parts of the protection layer are wet etched selective to the remainders of the protection layer.

As illustrated in FIG. 3C, native oxide 314 (the oxidized parts of protection layer 310, shown in FIG. 3B) is removed to expose parts of semiconductor channel layer 308 that are at the edges of the plum blossom shape, leaving remainders 310A, 310B, 310C, and 310D of protection layer 310 at the apices of the plum blossom shape. Native oxide 314 can be wet etched using any suitable etchants selective to remainders 310A, 310B, 310C, and 310D of protection layer 310 (e.g., with a selectivity higher than about 5) until native oxide 314 at the edges of the plum blossom shape are etched away, exposing parts of semiconductor channel layer 308 that are at the edges of the plum blossom shape. In some embodiments in which protection layer 310 includes silicon nitride, wet etchants including hydrofluoric acid are applied through gap 312 to selectively etch away native oxide 314 including silicon oxide, leaving remainders 310A, 310B, 310C, and 310D of protection layer 310 including silicon nitride. After the etching, parts of semiconductor channel layer 308 at the edges of the plum blossom shape are exposed, while parts of semiconductor channel layer 308 at the apices of the plum blossom shape are still covered and protected by remainders 310A, 310B, 310C, and 310D of protection layer 310 (as etch mask/stop layer), according to some embodiments.

As shown in FIG. 5B, at operation 512, the exposed parts of the semiconductor channel layer at the edges of the plum blossom shape are removed to separate the semiconductor channel layer into a plurality of semiconductor channels each at a respective apex of the plum blossom shape. In some embodiments, to remove the parts of the semiconductor channel layer, the semiconductor channel layer is wet etched until being stopped by the remainders of the protection layer.

As illustrated in FIG. 3D, the exposed parts of semiconductor channel layer 308 (shown in FIG. 3C) at the edges of the plum blossom shape are removed to separate semiconductor channel layer 308 into four separate semiconductor channels 308A, 308B, 308C, and 308D each at a respective apex of the plum blossom shape. Semiconductor channel layer 308 can be wet etched until being stopped by remainder 310A, 310B, 310C, and 310D of protection layer 310. That is, remainder 310A, 310B, 310C, and 310D of protection layer 310 can protect semiconductor channels 308A, 308B, 308C, and 308D from the wet etching. In some embodiments in which semiconductor channel layer 308 includes polysilicon, an etchant including tetramethylammonium hydroxide (TMAH) is applied through gap 312 to wet etch semiconductor channel layer 308. In some embodiments, the thickness of each semiconductor channel 308A, 308B, 308C, or 308D is nominally uniform in the plan view, such as between 10 nm and 15 nm, like semiconductor channel layer 308. A plurality of separate semiconductor channels 308A, 308B, 308C, and 308D each laterally disposed over part of continuous tunneling layer 306 at a respective apex of the plum blossom shape are hereby formed, according to some embodiments. Remainders 310A, 310B, 310C, and 310D of protection layer 310 still remain over separate semiconductor channels 308A, 308B, 308C, and 308D, respectively, after the wet etching of semiconductor channel layer 308, and correspond to petal capping layers 216A, 216B, 216C, and 216D shown in FIG. 2A, according to some embodiments.

As shown in FIG. 5B, at operation 514, a core capping layer is formed to fill the channel hole. As illustrated in FIG. 3E, a layer of silicon oxide, or any other dielectrics different the material of remainders 310A, 310B, 310C, and 310D of protection layer 310, may be deposited into gap 312 (shown in FIG. 3D) to completely fill the channel hole (without air gap) or partially fill the channel hole (with air gap) using one or more thin film deposition processes including, but not limited to, PVD, CVD, ALD, or any combination thereof to form a core capping layer 316.

Referring back to FIG. 4, method 400 proceeds to operation 408, in which a plurality of separate channel plugs each disposed above and in contact with a respective one of the plurality of separate semiconductor channels are formed. As shown in FIG. 5B, at operation 516, a top portion of a remainder of the protection layer at each apex of the plum blossom shape is removed to form a recess.

As illustrated in FIG. 3F, recesses 318A, 318B, 318C, and 318D are formed at the apices of the plum blossom shape by etching back the top portions of remainders 310A, 310B, 310C, and 310D of protection layer 310, respectively. In some embodiments, wet etching is used to selectively etch remainders 310A, 310B, 310C, and 310D of protection layer 310. For example, wet etchants including phosphoric acid may be applied to use the top portions of remainders 310A, 310B, 310C, and 310D of protection layer 310 including silicon nitride. The etching depth (i.e., the depth of recess 318A, 318B, 318C, or 318D) can be controlled by controlling the etch rate and/or time. Although not shown in FIG. 3F, it is understood that in some embodiments, charge trapping layer 304 may include silicon nitride, the same material as remainders 310A, 310B, 310C, and 310D of protection layer 310, and thus, can be etched as well. Due to the smaller thickness of charge trapping layer 304 in the x-y plane compared with that of remainders 310A, 310B, 310C, and 310D of protection layer 310, the etching depth of charge trapping layer 304 may be smaller than that of remainders 310A, 310B, 310C, and 310D in some examples. Although not show, it is understood that in one examples, the top portion of tunneling layer 306 or the top portions of tunneling layer 306 and charge trapping layer 304 may be etched back as well to become part of recesses 318A, 318B, 318C, and 318D.

As shown in FIG. 5B, at operation 518, a semiconductor material is deposited into the recess to a channel plug at each apex of the plum blossom shape. As illustrated in FIG. 3G, four separate channel plugs 320A, 320B, 320C, and 320D are formed at apices of the plum blossom shape. Each channel plug 320A, 320B, 320C, or 320D is formed above and in contact with a respective semiconductor channel 308A, 308B, 308C, or 308D as well as above and in contact with a respective remainder 310A, 310B, 310C, or 310D of protection layer 310, according to some embodiments. To form channel plugs 320A, 320B, 320C, and 320D, a semiconductor material, such as polysilicon, or any other semiconductor materials, for example, the same material as semiconductor channels 308A, 308B, 308C, and 308D, can be deposited to fill recesses 318A, 318B, 318C, and 318D (shown in FIG. 3F) using one or more thin film deposition processes including, but not limited to, PVD, CVD, ALD, or any combination thereof. In some embodiments, a planarization process, such as etching and/or CMP, is performed to remove excess deposited semiconductor material and planarize the top surface of the channel structure, for example, removing any recess of charge trapping layer 304 formed with recesses 318A, 318B, 318C, and 318D.

According to one aspect of the present disclosure, a 3D memory device includes a substrate and a channel structure extending vertically above the substrate and having a plum blossom shape including a plurality of petals in a plan view. The channel structure includes, in each of the plurality of petals, a semiconductor channel and a channel plug above and in contact with the semiconductor channel.

In some embodiments, a number of the petals is greater than 2.

In some embodiments, the plurality of semiconductor channels are separated from one another, and the plurality of channel plugs are separated from one another.

In some embodiments, a thickness of each of the plurality of semiconductor channels is nominally uniform in the plan view.

In some embodiments in each of the plurality of petals, a lateral dimension of the channel plug is greater than a lateral dimension of the semiconductor channel.

In some embodiments, the channel structure further includes a blocking layer, a charge trapping layer, and a tunneling layer from outside to inside in this order in the plan view, and each of the blocking layer, charge trapping layer, and tunneling layer is a continuous layer following the plum blossom shape of the channel structure.

In some embodiments, the channel structure further includes, in each of the plurality of petals, a petal capping layer coplanar with the semiconductor channel. In some embodiments, the channel plug is laterally aligned with the semiconductor channel and the petal capping layer.

In some embodiments, a thickness of each of the plurality of petal capping layers is nonuniform in the plan view.

In some embodiments, the 3D memory device further includes a core capping layer filling a remaining space of the channel structure. In some embodiments, the petal capping layer and the core capping layer include different dielectric materials.

In some embodiments, the blocking layer, charge trapping layer, tunneling layer, semiconductor channel, petal capping layer, and core capping layer include silicon oxide, silicon nitride, silicon oxide, polysilicon, silicon nitride, and silicon oxide, respectively.

In some embodiments, a thickness of each of the blocking layer, charge trapping layer, and tunneling layer is nominally uniform in the plan view.

In some embodiments, each of the plurality of semiconductor channels is laterally disposed over part of the tunneling layer at an apex of a respective one of the petals.

In some embodiments, the semiconductor channel and the channel plug include a same semiconductor material.

According to another aspect of the present disclosure, a 3D memory device includes a continuous blocking layer, a continuous charge trapping layer, and a continuous tunneling layer each following a plum blossom shape from outside to inside in this order in a plan view. The 3D memory device also includes a plurality of separate semiconductor channels each disposed laterally over part of the continuous tunneling layer at a respective apex of the plum blossom shape, and a plurality of separate petal capping layers each disposed laterally over a respective one of the plurality of semiconductor channels. The 3D memory device further includes a continuous core capping layer laterally surrounded by the plurality of petal capping layers and the tunneling layer. The petal capping layer and the core capping layer include different dielectric materials.

In some embodiments, the blocking layer, charge trapping layer, tunneling layer, semiconductor channel, petal capping layer, and core capping layer include silicon oxide, silicon nitride, silicon oxide, polysilicon, silicon nitride, and silicon oxide, respectively.

In some embodiments, a number of the semiconductor channels is greater than 2.

In some embodiments, a thickness of each of the blocking layer, charge trapping layer, tunneling layer, and semiconductor channel is nominally uniform in the plan view.

In some embodiments, a thickness of each of the petal capping layers is nonuniform in the plan view.

In some embodiments, the 3D memory device includes a plurality of channel plugs each disposed above and in contact with a respective one of the plurality of semiconductor channels and a respective one of the plurality of petal capping layers.

In some embodiments, the semiconductor channel and the channel plug include a same semiconductor material.

According to still another aspect of the present disclosure, a method for forming a 3D memory device is disclosed. A channel hole extending vertically above a substrate and having a plum blossom shape in a plan view is formed. A blocking layer, a charge trapping layer, a tunneling layer, and a semiconductor channel layer each following the plum blossom shape along sidewalls of the channel hole are sequentially formed. A protection layer is formed over the semiconductor channel layer, such that an apex thickness of the protection layer at each apex of the plum blossom shape is greater than an edge thickness of the protection layer at edges of the plum blossom shape. Parts of the protection layer that are at the edges of the plum blossom shape are oxidized. The oxidized parts of the protection layer are removed to expose parts of the semiconductor channel layer that are at the edges of the plum blossom shape, leaving a remainder of the protection layer at each apex of the plum blossom shape. The exposed parts of the semiconductor channel layer are removed to separate the semiconductor channel layer into a plurality of semiconductor channels each at a respective apex of the plum blossom shape.

In some embodiments, the plum blossom shape includes a plurality of petals, and the semiconductor channels are formed in the plurality of petals, respectively.

In some embodiments, a number of the petals is greater than 2.

In some embodiments, to sequentially form the blocking layer, charge trapping layer, tunneling layer, and semiconductor channel layer, layers of silicon oxide, silicon nitride, silicon oxide, and polysilicon are sequentially deposited along the sidewalls of the channel hole.

In some embodiments, the deposition includes ALD.

In some embodiments, a thickness of the semiconductor channel layer is nominally uniform in the plan view.

In some embodiments, the oxidation includes wet oxidation or chemical oxidation.

In some embodiments, to remove the oxidized parts of the protection layer, the oxidized parts of the protection layer are wet etched selective to the remainders of the protection layer.

In some embodiments, to remove the exposed parts of the semiconductor channel layer, the semiconductor channel layer is wet etched until being stopped by the remainders of the protection layer.

In some embodiments, after removing the exposed parts of the semiconductor channel layer, a core capping layer is formed to fill the channel hole.

In some embodiments, after forming the core capping layer, a top portion of the remainder of the protection layer at each apex of the plum blossom shape is removed to form a recess, and a semiconductor material is deposited into the recess to form a channel plug at each apex of the plum blossom shape.

According to yet another aspect of the present disclosure, a method for forming a 3D memory device is disclosed. A channel hole extending vertically above a substrate and having a plum blossom shape in a plan view is formed. A continuous blocking layer, a continuous charge trapping layer, and a continuous tunneling layer each following the plum blossom shape are formed from outside to inside in this order along sidewalls of the channel hole. A plurality of separate semiconductor channels each disposed laterally over part of the continuous tunneling layer at a respective apex of the plum blossom shape are formed. A plurality of separate channel plugs each disposed above and in contact with a respective one of the plurality of separate semiconductor channels are formed.

In some embodiments, the plum blossom shape includes a plurality of petals, and the semiconductor channels and channel plugs are formed in the plurality of petals, respectively.

In some embodiments, a number of the petals is greater than 2.

In some embodiments, to form the continuous blocking layer, continuous charge trapping layer, and continuous tunneling layer layers of silicon oxide, silicon nitride, and silicon oxide are sequentially deposited along the sidewalls of the channel hole.

In some embodiments, the deposition includes ALD.

In some embodiments, to form the plurality of separate semiconductor channels, a continuous semiconductor channel layer and a continuous protection layer are sequentially formed over the continuous tunneling layer, such that an apex thickness of the continuous protection layer at each apex of the plum blossom shape is greater than an edge thickness of the protection layer at edges of the plum blossom shape, parts of the continuous protection layer that are at the edges of the plum blossom shape are oxidized, the oxidized parts of the continuous protection layer are removed to expose parts of the continuous semiconductor channel layer that are at the edges of the plum blossom shape, and the exposed parts of the continuous semiconductor channel layer are removed to separate the continuous semiconductor channel layer into the plurality of semiconductors.

In some embodiments, to form the continuous semiconductor channel layer and the continuous protection layer, a layer of polysilicon and a layer of silicon nitride are sequentially deposited without filling the channel hole.

In some embodiments, to form the plurality of separate channel plugs, a top portion of a remainder of the continuous protection layer at each apex of the plum blossom shape is removed to form a recess, and a semiconductor material is deposited into the recess to a channel plug at each apex of the plum blossom shape.

In some embodiments, after forming the plurality of separate semiconductor channels, a core capping layer is formed to fill the channel hole.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate; and
   a channel structure extending vertically above the substrate and having a plum blossom shape comprising a plurality of petals in a plan view,
   wherein;
   the channel structure comprises, in each of the plurality of petals, a semiconductor channel and a channel plug above and in contact with the semiconductor channel; and
   the channel structure further comprises a memory film surrounding each semiconductor channel within the plurality of petals, the memory film extending continuously across the semiconductor channels in the plurality of petals.

2. The 3D memory device of claim 1, wherein a number of the petals is greater than 2.

3. The 3D memory device of claim 1, wherein the plurality of semiconductor channels are separated from one another, and the plurality of channel plugs are separated from one another.

4. The 3D memory device of claim 1, wherein a thickness of each of the plurality of semiconductor channels is nominally uniform in the plan view.

5. The 3D memory device of claim 1, wherein in each of the plurality of petals, a lateral dimension of the channel plug is greater than a lateral dimension of the semiconductor channel.

6. The 3D memory device of claim 1, wherein the channel the memory film comprises a blocking layer, a charge trapping layer, and a tunneling layer from outside to inside in this order in the plan view, and each of the blocking layer, the charge trapping layer, and the tunneling layer is a continuous layer following the plum blossom shape of the channel structure.

7. The 3D memory device of claim 6, wherein the channel structure further comprises, in each of the plurality of petals, a petal capping layer coplanar with the semiconductor channel, and the channel plug is laterally aligned with the semiconductor channel and the petal capping 3D .

8. The 3D memory device of claim 7, wherein a thickness of each of the plurality of petal capping layers is nonuniform in the plan view.

9. The 3D memory device of claim 7, further comprising a core capping layer filling a remaining space of the channel structure, wherein the petal capping layer and the core capping layer comprise different dielectric materials.

10. The 3D memory device of claim 9, wherein the blocking layer, the charge trapping layer, the tunneling layer, the semiconductor channel, the petal capping layer, and the core capping layer comprise silicon oxide, silicon nitride, silicon oxide, polysilicon, silicon nitride, and silicon oxide, respectively.

11. The 3D memory device of claim 6, wherein a thickness of each of the blocking layer, the charge trapping layer, and the tunneling layer is nominally uniform in the plan view.

12. The 3D memory device of claim 6, wherein each of the plurality of semiconductor channels is laterally disposed over part of the tunneling layer at an apex of a respective one of the petals.

13. The 3D memory device of claim 1, wherein the semiconductor channel and the channel plug comprise a same semiconductor material.

14. The 3D memory device of claim 1,
   each of the plurality of petals comprises an apex; and
   each apex of the plurality of petals comprises a curved shape.

15. The 3D memory device of claim 1, wherein:
   the plurality of semiconductor channels are separated from one another at intersections where one petal of the plurality of petals intersects with another petal of the plurality of petals.

16. The 3D memory device of claim 1, wherein:
   the plurality of channel plugs are separated from one another at intersections where one petal of the plurality of petals intersects with another petal of the plurality of petals.

17. The 3D memory device of claim 1, wherein:
   the channel structure further comprises, in each of the plurality of petals, a petal capping layer over a respective semiconductor channel; and
   a thickness of one petal capping layer of the plurality of petal capping layers, in the plan view, is reduced from an apex of a corresponding petal of the plurality of petals toward an intersection where the petal and an adjacent petal intersect.

18. The 3D memory device of claim 1, wherein:
   a thickness of one channel plug of the plurality of channel plugs, in the plan view, is reduced from an apex of a corresponding petal of the plurality of petals toward an intersection where the petal and an adjacent petal intersect.

19. The 3D memory device of claim 1, wherein:
   one petal of the plurality of petals intersects with another petal of the plurality of petals at an intersection; and
   the intersection comprises a curved shape.

20. The 3D memory device of claim 1, wherein:
   the channel structure further comprises, in each of the plurality of petals, a petal capping layer over a respective semiconductor channel; and one channel plug of the channel plugs is above and in contact with a corresponding petal capping layer of the plurality of petal capping layers.

* * * * *